(12) United States Patent
Chen et al.

(10) Patent No.: US 12,057,445 B2
(45) Date of Patent: Aug. 6, 2024

(54) METHOD OF MANUFACTURING A SEMICONDUCTOR DEVICE AND A SEMICONDUCTOR DEVICE

(71) Applicant: TAIWAN SEMICONDUCTOR MANUFACTURING COMPANY, LTD., Hsinchu (TW)

(72) Inventors: Wen-Tzu Chen, Taoyuan (TW); Szu-Ping Tung, Taipei (TW); Guan-Yao Tu, Hsinchu (TW); Hsiang-Ku Shen, Hsinchu (TW); Chen-Chiu Huang, Taichung (TW); Dian-Hau Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 175 days.

(21) Appl. No.: 17/575,165

(22) Filed: Jan. 13, 2022

(65) Prior Publication Data

US 2023/0037025 A1 Feb. 2, 2023

Related U.S. Application Data

(60) Provisional application No. 63/227,668, filed on Jul. 30, 2021.

(51) Int. Cl.
*H01L 29/94* (2006.01)
*H01L 21/762* (2006.01)
*H01L 27/02* (2006.01)
*H01L 27/06* (2006.01)
*H01L 29/06* (2006.01)
*H01L 29/76* (2006.01)

(52) U.S. Cl.
CPC ........ *H01L 27/0629* (2013.01); *H01L 21/762* (2013.01); *H01L 27/0207* (2013.01); *H01L 29/0649* (2013.01)

(58) Field of Classification Search
CPC ............... H01L 27/0629; H01L 21/762; H01L 27/0207; H01L 29/0649; H01L 27/0802; H01L 28/24
USPC ........................................................ 257/379
See application file for complete search history.

(56) References Cited

U.S. PATENT DOCUMENTS 9,773,731 B2 9/2017 Hu et al.
2011/0128692 A1* 6/2011 Gaul ....................... H01L 28/24
257/536

* cited by examiner

*Primary Examiner* — Theresa T Doan
(74) *Attorney, Agent, or Firm* — STUDEBAKER & BRACKETT PC

(57) ABSTRACT

A semiconductor device includes a transistor structure disposed over a substrate, a first interlayer dielectric (ILD) layer disposed over the transistor structure, a second ILD layer disposed over the first ILD layer, and a first resistor wire disposed on the second ILD layer, and a second resistor wire disposed on the second ILD layer. A sheet resistance of the first resistor wire is different from a sheet resistance of the second resistor wire.

20 Claims, 16 Drawing Sheets

| Power | 3.2kw | 3.8kw | 2.9kw |
|---|---|---|---|
| Sheet Resistance (Ohm-square) | 84 | 75 | 99.8 |
| Structure | TiN | TiN | TiN |

Fig. 5A

| By layer | 0+30 | 5+25 | 10+20 |
|---|---|---|---|
| Sheet Resistance (Ohm-square) | 98.9 | 99.8 | 118.6 |
| $2^{nd}$ TiN (nm) | 30 | 25 | 20 |
| $1^{st}$ TiN (nm) | 0 | 5 | 10 |
| Structure | $1^{st}$ TiN | $2^{nd}$ TiN / $1^{st}$ TiN | $2^{nd}$ TiN / $1^{st}$ TiN |

Fig. 5B

| Treatment | Skip | Soft | heavy |
|---|---|---|---|
| Sheet Resistance (Ohm-square) | 29.8 | 35.1 | 40.6 |
| TiOx THK (A) | 0 | 30 | 70 |
| TiN (A) | 290 | 260 | 220 |
| Structure | TiN | TiOx / TiN | TiOx / TiN |

Fig. 5C

METHOD OF MANUFACTURING A SEMICONDUCTOR DEVICE AND A SEMICONDUCTOR DEVICE

RELATED APPLICATIONS

This application claims priority to U.S. Provisional Patent Application No. 63/227,668 filed Jul. 30, 2021, the entire contents of which are incorporated herein by reference.

BACKGROUND

In a semiconductor device, such as an integrated circuit (IC) or a large scale integration (LSI), a lot of resistors are used. Some of the resistors are formed by forming diffusion regions in a substrate and some of the resistors are formed by forming conductive layers in upper layers above the underlying structures. As dimensions of semiconductor devices decrease, a more flexible design of resistor wires is required.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 5A, 5B and 5C show various views of resistor wires according to embodiments of the present disclosure.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of" Further, in the following fabrication process, there may be one or more additional operations in between the described operations, and the order of operations may be changed. In the present disclosure, the phrase "at least one of A, B and C" means either one of A, B, C, A+B, A+C, B+C or A+B+C, and does not mean one from A, one from B and one from C, unless otherwise explained. Materials, configurations, structures, operations and/or dimensions explained with one embodiment can be applied to other embodiments, and detained description thereof may be omitted.

Figure 1A:
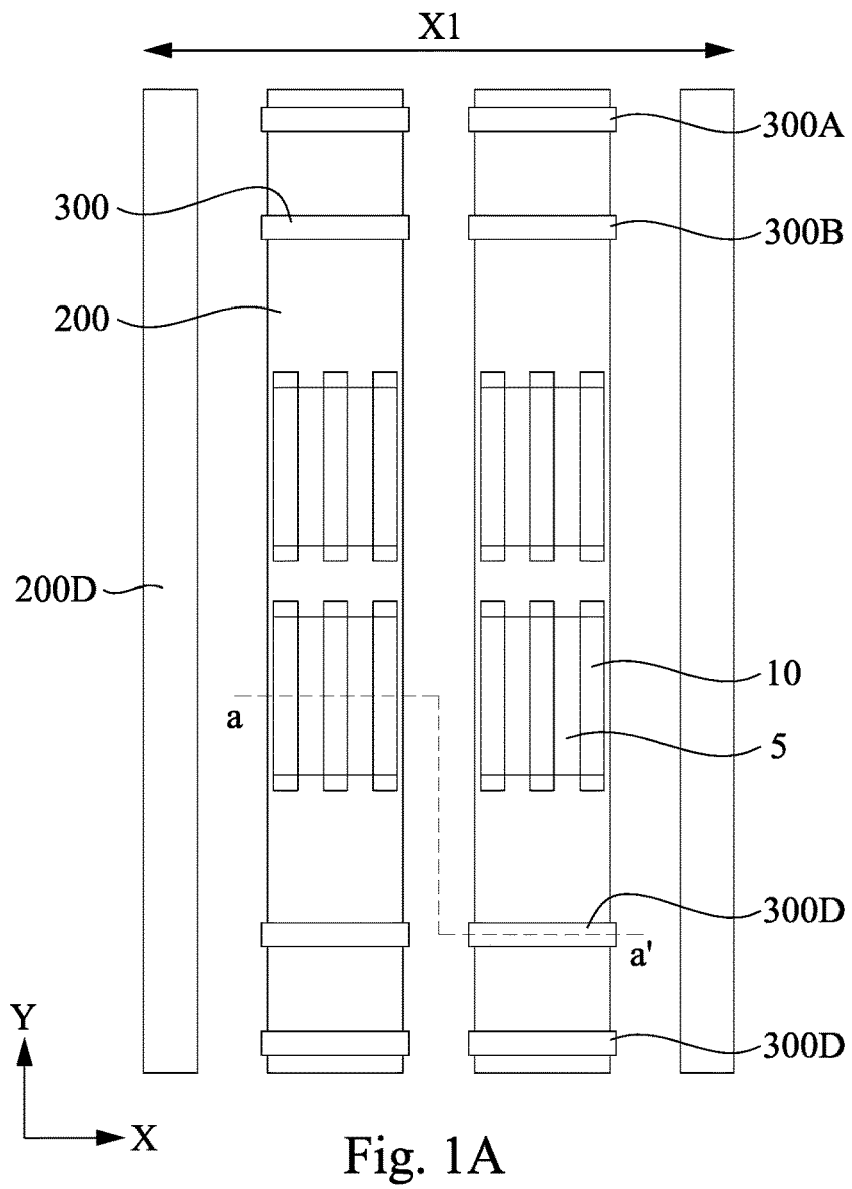
FIG. 1A shows an exemplary plan view (viewed from the above) illustrating a layout structure of a semiconductor device according to one embodiment of the present disclosure.
Figure 1B:
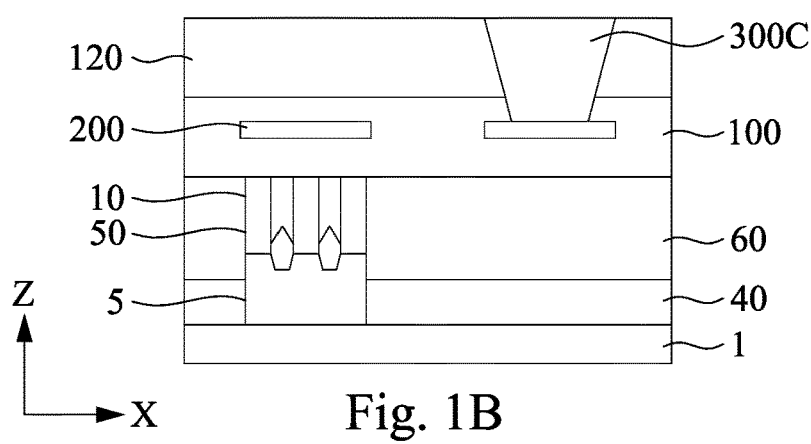
FIG. 1B shows an exemplary cross sectional view along line a-a' of FIG. 1A.

FIG. 1A shows an exemplary plan view (viewed from the above) illustrating a layout structure of a semiconductor device according to one embodiment of the present disclosure. FIG. 1B shows an exemplary cross sectional view along line a-a' of FIG. 1A.

In FIGS. 1A and 1B, a resistor wire 200 extending in the Y direction is provided. The resistor wire 200 is made of a conductive material, such as a metal nitride. Since the resistor wire 200 is a resistor, the conductivity of the resistor wire 200 is relatively low compared with other wires for transferring signals. The resistivity (sheet resistance) of the resistor wire 200 is in a range from about 1Ω/□ to about 1000Ω/□, in some embodiments, and is in a range from about 10Ω/□ to about 200Ω/□ in other embodiments. The material for the resistor wire 200 includes, for example, a transition metal nitride (e.g., TiN, TaN), a titanium oxide, a tantalum oxide or TiSiN or any combination thereof.

The size and thickness of the resistor wire 200 may vary depending on the purposes or applications of the resistor wire 200. Accordingly, it is desirable to provide resistors with various resistance values in a semiconductor device.

As shown in FIG. 1A, the resistor wire 200 includes contacts (or vias) 300 for the resistor wire 200 to be connected to another circuit element via upper layer metal wires. In some embodiments, only four contacts 300A, 300B, 300C and 300D are provided on the resistor wire 200. The contacts 300A and 300D are used to provide a current flow therebetween and the contacts 300B and 300C are used to measure a voltage or obtain a voltage drop in some embodiments.

In FIGS. 1A and 1B, two resistor wires 200 arranged in the X direction are shown. Further, dummy wire patterns 200D are disposed at both sides of the resistor wires 200 along the X direction to improve pattern fidelity in patterning operations, such as lithography and etching.

However, the layout of the resistor wire 200 is not limited to these figures. The number of the resistor wires 200 may be as small as one or three or more with (and between) or without two dummy wire patterns.

As shown in FIGS. 1A and 1B, just under the resistor wire 200, one or more device patterns are formed. In some embodiments, the device patterns include a transistor, a capacitor, or any other electronic device (active devices). In other embodiments, the device patterns include a dummy pattern that does not function as an electronic circuit.

In some embodiments, the device pattern includes a fin structure 5, gate structures 10 and source/drain (S/D) structures 50, which are part of an active device or a dummy pattern, are disposed over a substrate 1. As shown in FIG. 1A, the resistor wire 200 overlaps the fin structure 5 and the gate structures 10 in plan view. In other words, the resistor wire 200 is aligned with the fin structure 5 along the Y direction. Each of the gate structures 10 may include a gate dielectric layer and a gate electrode layer. In the present disclosure, a dummy "element" means that the "element" has no electrical function or is not part of a functioning circuit, and "a plan view" means a view along the normal line (the Z direction) of the substrate 1 toward the substrate 1 from above.

In one embodiment, plural gate structures 10 are disposed over a part of the fin structure 5. The plural gate structures 10 extend in the Y direction and the fin structure 5 extends in the X direction. As shown in FIG. 1A, plural fin structures 5 are disposed under one resistor wire 200 and are aligned along the Y direction. The number of the fin structures per resistor wire is not limited two, and the number may be one or three or more.

In one embodiment, plural gate structures 10 (and thus plural gate electrode layers) are disposed over one fin structure 5, as shown in FIGS. 1A and 1B. However, the number of the gate structures may be as small as one per fin structure and more than three per fin structure. As shown in FIG. 1A, the resistor wire 200 overlaps all three gate structures in plan view. In some embodiments, the gate structures 10 extend in the Y direction and are disposed over two or more fin structures 5. In plan view, the fin structure 5 and the gate structures 10 are disposed between a pair of contacts 300A and 300D and a pair of the contacts 300B and 300C, and thus the contacts 300 do not overlap the gate structures 10. In other embodiments, however, at least one of the contacts 300 overlaps the gate structures 10.

As shown in FIG. 1B, the fin structure 5 is disposed over the substrate 1, the gate structures 10 are disposed over a part of the fin structure 5, and an isolation insulating layer 40 (e.g., shallow trench isolation (STI)) is also disposed over the substrate 1. The fin structure 5 is partially embedded in the isolation insulating layer 40. Further, a first interlayer dielectric (ILD) layer 60 is formed over the fin structure 5. The gate structures 10 are embedded in the first ILD layer 60. A second ILD layer 100 is further disposed over the first ILD layer 60. The resistor wire 200 is embedded in the second ILD layer 100. A third ILD layer 120 is further disposed over the second ILD layer 100. The contact 300 is formed in the second and third ILD layers. In some embodiments, the contact 300 is formed in the second ILD layer 100 only.

Figure 2A:
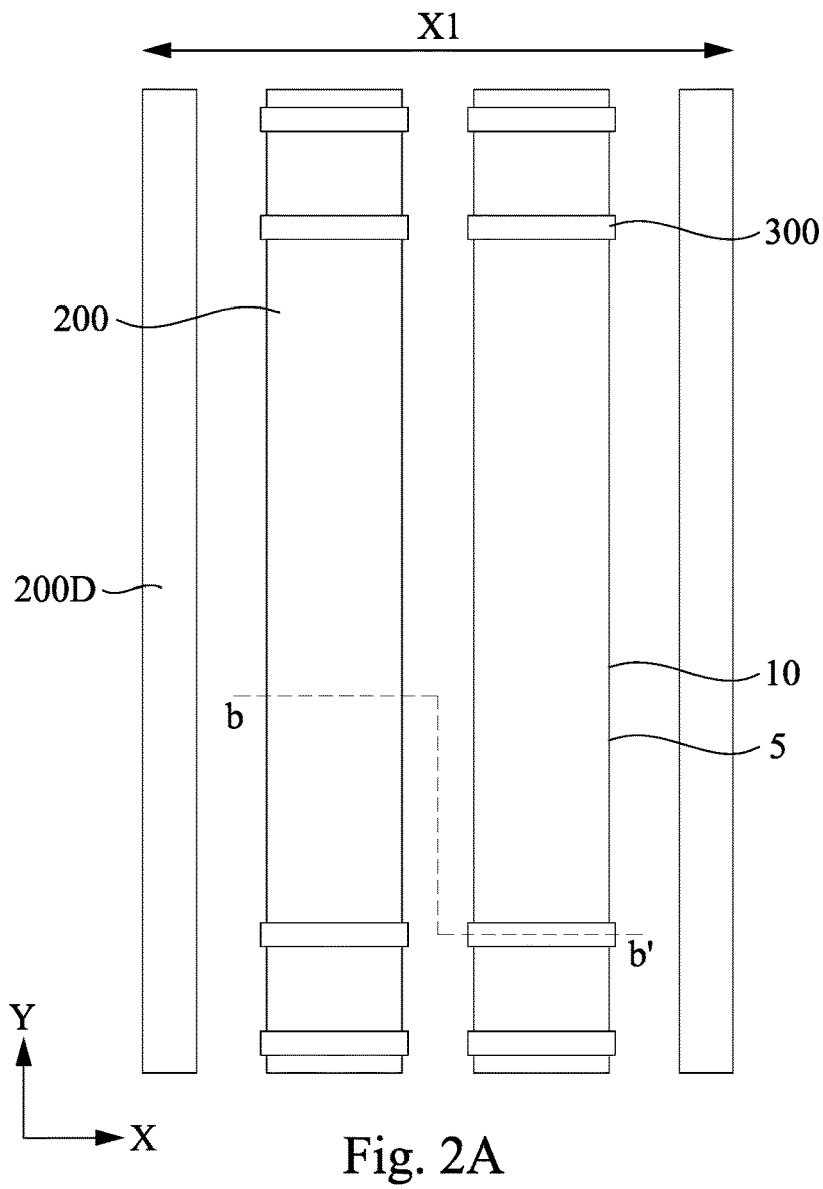
FIG. 2A shows an exemplary plan view illustrating a layout structure of a semiconductor device according to one embodiment of the present disclosure.
Figure 2B:
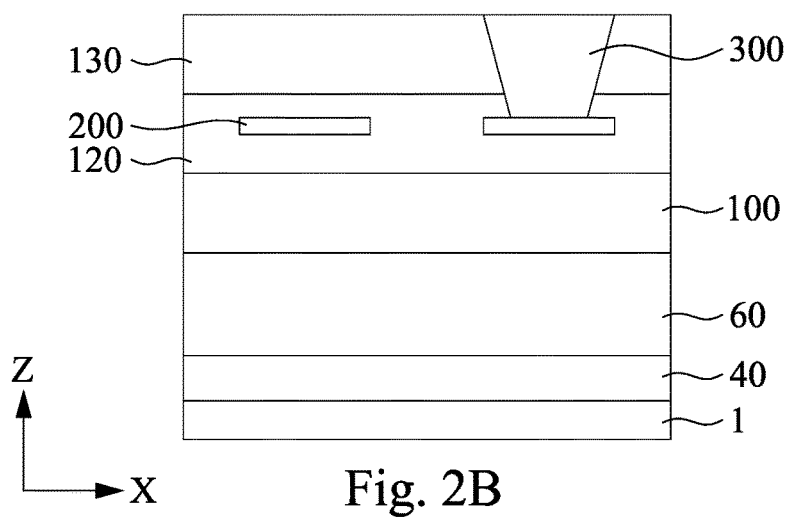
FIG. 2B shows an exemplary cross sectional view along line b-b' of FIG. 2A.

FIG. 2A shows an exemplary plan view illustrating a layout structure of a semiconductor device according to one embodiment of the present disclosure. FIG. 2B shows an exemplary cross sectional view along line b-b' of FIG. 2A.

In some embodiments, no transistor is disposed below the resistor wire 200, as shown in FIGS. 2A and 2B. In some embodiments, one or more wiring patterns are disposed between the resistor wire 200 and the substrate. In some embodiments, an entirety of the resistor wire 200 is disposed over the isolation insulating layer 40 (e.g., shallow trench isolation (STI)) embedded in the substrate.

As shown in FIG. 2B, a first interlayer dielectric (ILD) layer 60 is formed over the isolation insulating layer 40, and a second ILD layer 100 is further disposed over the first ILD layer 60. A third ILD layer 120 is further disposed over the second ILD layer 100. The resistor wire 200 is embedded in the third ILD layer 120, not in the second ILD layer 100. A fourth ILD layer 130 is further disposed over the third ILD layer 120. The contact 300 is formed in the third and fourth ILD layers. In some embodiments, the contact 300 is formed in the third ILD layer 120 only. Compared with the structure of FIG. 1B, two or more additional ILD layers are interposed between the ILD layer in which the resistor wire 200 is disposed and the isolation insulating layer 40, in the structure of FIG. 2B.

Each of the first, second and third ILD layers is made of one or more of silicon dioxide ($SiO_2$), SiON, SiCO, SiCN, SiOCN, or any other low-k materials in some embodiments. The ILD layers are formed by CVD, physical vapor deposition (PVD) including sputtering, atomic layer deposition (ALD), or other suitable film formation methods in some embodiments. In some embodiments, immediately adjacent ILD layers are made of different materials.

Figure 3:
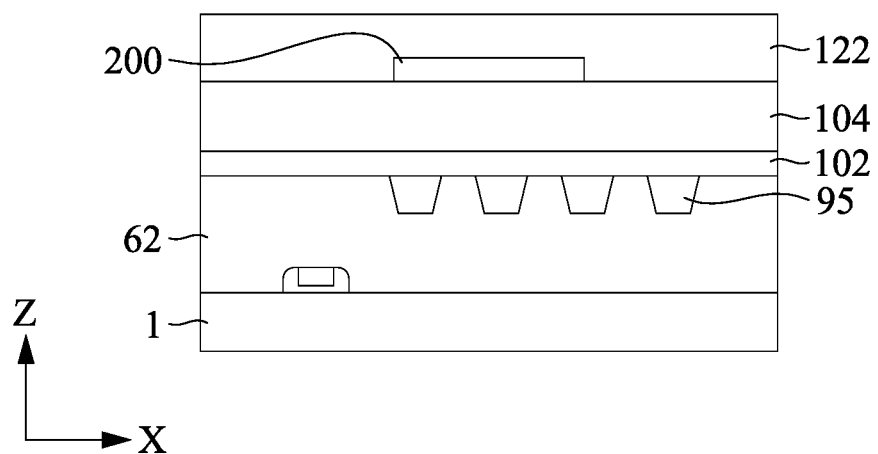
FIG. 3 shows an exemplary cross sectional view of a semiconductor device according to one embodiment of the present disclosure.

FIG. 3 shows a cross sectional view of a semiconductor device according to another embodiment of the present disclosure. In some embodiments, one or more wiring patterns 95 are formed at an upper surface portion of a lower ILD layer 62, which includes one or more ILD layers. In some embodiments, a first dielectric layer 102 is formed over the lower ILD layer 62, and a second dielectric layer 104 is formed over the first dielectric layer 102. A resistor wire 200 is formed over the second dielectric layer 104 and a third dielectric layer 122 is formed over the second ILD layer and the resistor wire 200, in some embodiments.

In some embodiments, the lower ILD layer 62 includes one or more layers of silicon dioxide ($SiO_2$), SiON, SiCO, SiCN, SiOCN, or any other low-k materials. In some embodiments, the first dielectric layer 102 includes one or more of silicon oxide, SiCN, SiOCN, SiOC or any other low-k materials. In certain embodiments, SiCN is used as the first dielectric layer 102. In some embodiments, the second dielectric layer 102 is made of a different material than the first dielectric layer 102 and includes one or more of SiON, SiCN, SiOCN, silicon nitride or any other suitable dielectric materials. In certain embodiments, silicon nitride is used as the second dielectric layer 104. In some embodiments, the third dielectric layer 122 includes one or more of silicon oxide, silicon nitride, SiON, SiCN, SiOCN, SiOC or any other low-k materials. In some embodiments, the third dielectric layer 122 is made of a different material than the second dielectric layer 104.

The structures below and above the ILD layer in which the resistor wires 200 are embedded are interchangeable among the embodiments of FIGS. 1B, 2B and 3.

FIGS. 4A-4D show various stages of the sequential fabrication process of a semiconductor device according to an embodiment of the present disclosure. It is understood that additional operations can be provided before, during, and after processes shown by FIGS. 4A-4D, and some of the operations described below can be replaced or eliminated, for additional embodiments of the method. The order of the operations/processes may be interchangeable. Further, materials, configurations, dimensions and/or processes as explained with respect to the foregoing embodiments may be employed in the following embodiment, and the detailed explanation may be omitted.

Figure 4A:
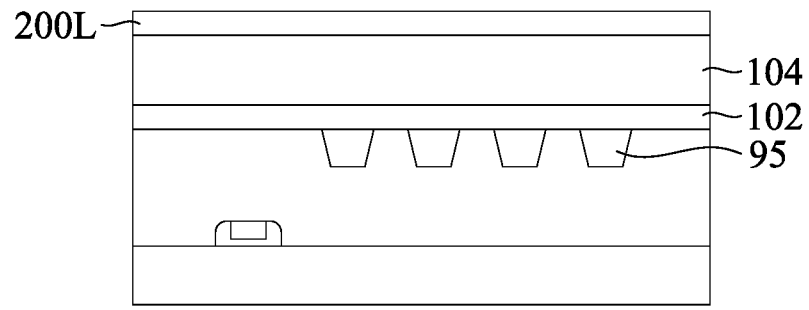
FIGS. 4A, 4B, 4C and 4D show cross sectional views of various stages of a sequential manufacturing process for a semiconductor device according to the present disclosure.
Figure 4B:
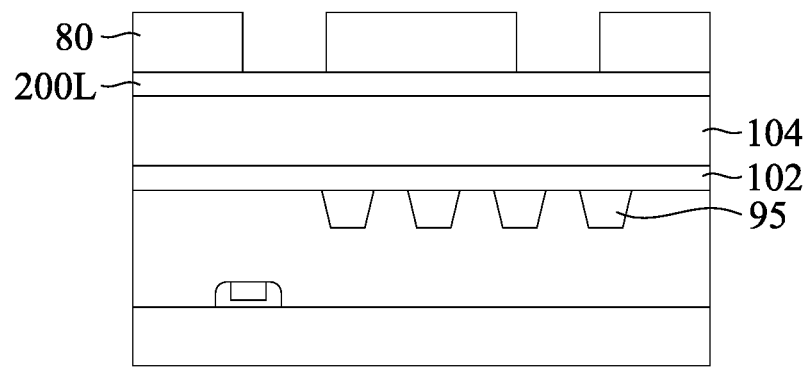
Figure 4C:
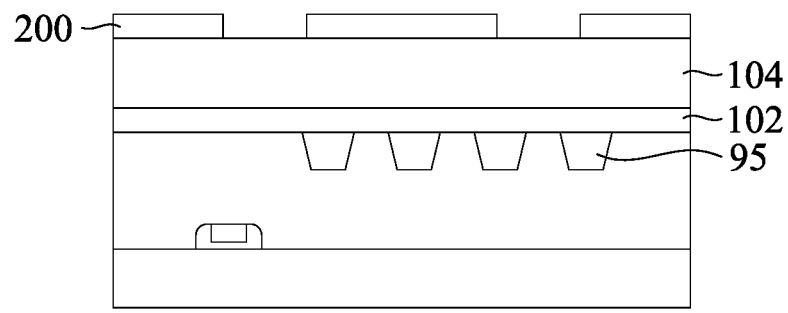
Figure 4D:
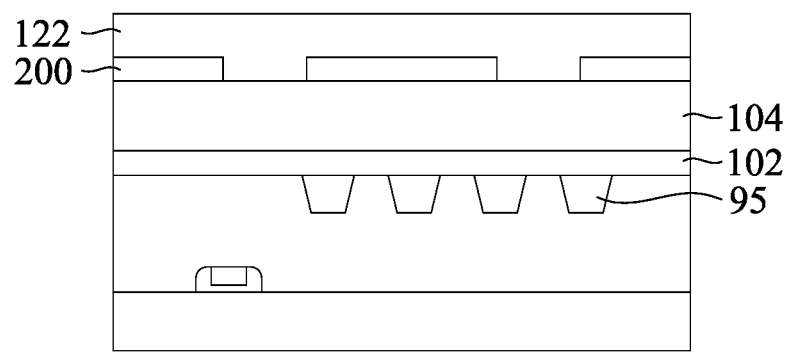

After the second dielectric layer 104 is formed, a blanket layer of metallic material 200L for a resistor wire is formed over the second dielectric layer 104 as shown in FIG. 4A. The blanket layer may be formed by CVD including plasma enhanced CVD (PECVD), physical vapor deposition (PVD) including sputtering or other suitable film formation methods. Then, a mask layer 80, such as a photo resist pattern, is formed over the metallic layer 200L as shown in FIG. 4B, and a patterning operation is performed so as to obtain the resistor wires 200 as shown in FIG. 4C. Subsequently, the third dielectric layer 122 is formed over the resistor wires 200 as shown in FIG. 4D. In some embodiments, after the third dielectric layer 122 is formed, the contacts 300 (see, FIGS. 1A-2B) are formed to contact the resistor wire 200. The sheet resistance of the metallic layer 200L (the resistor wire 200) can be adjusted by adjusting one or more parameters of depositing the metallic layer 200L. In some embodiments, different resistance values of the resistor wires are required for different semiconductor devices. The resistance value of the resistor wires is a product of the sheet resistance and an area in plan view of the resistor wire. In some embodiments, a different resistor value can be obtained by adjusting the area of the resistor wire (i.e., different layout patterns), which may affect the flexibility of the circuit design. In embodiments of the present disclosure, the sheet resistance value is adjusted to obtain different resistor values. In some embodiments, a thickness of the blanket metallic layer 200L is in a range from about 10 nm to about 80 nm, and is in a range from about 20 nm to about 40 nm in other embodiments.

In some embodiments, the metallic layer 200L is a TiN layer or a TaN layer formed by a sputtering process. In some embodiments, by adjusting an input electric power during the sputtering process, the sheet resistance value of the metallic layer 200L is adjusted. In some embodiments, by increasing the input power by 20%, the sheet resistance decreases by about 10%, and by decreasing the input power by 10%, the sheet resistance increases by about 20%. This is caused by different structures, e.g., crystallinity, of the metallic layer. FIG. 5A shows embodiments of a TiN layer. Accordingly, when a desired sheet resistance value for a resistor wire is given, for example, by a circuit/device designer (device specification), the input power of the sputtering process is adjusted to obtain a desired sheet resistance for the metallic layer 200L. In other embodiments, the metallic layer 200L is formed by PECVD, and the sheet resistance is adjusted by adjusting an input electric power for generating the plasma.

In some embodiments, by combining two or more layers formed by different conditions, the sheet resistance value of the metallic layer 200L is adjusted. In some embodiments, the metallic layer 200L includes a single layer or bi-layers as shown in FIG. 5B. One of the bi-layers (e.g., the upper layer) has a higher sheet resistance than the other layer. Accordingly, by adjusting the thicknesses of each of the bi-layers, different sheet resistance values are obtained as shown in FIG. 5B. In some embodiments, the total thickness does not change. Accordingly, when a desired sheet resistance value for a resistor wire is given, for example, by a circuit/device designer (device specification), the thicknesses of the one or more layers of the metallic layer 200L are adjusted to obtain a desired sheet resistance for the metallic layer 200L.

In some embodiments, by forming an oxide or oxynitride layer on the metallic layer 200L, the sheet resistance value of the metallic layer 200L is adjusted. In some embodiments, the metallic layer 200L includes a body metallic layer and an oxide layer formed on the body layer as shown in FIG. 5C. The oxide layer has a much a higher sheet resistance than the body layer. Accordingly, by adjusting the thicknesses of each of the layers, different sheet resistance values are obtained as shown in FIG. 5C. In some embodiments, the oxide layer is formed by treating the surface region of the metallic layer 200L as deposited by an oxygen containing gas or plasma. In some embodiments, one or more of treatment time or intensity of oxidation (e.g., plasma power, oxygen concentration and/or flow rate of an oxygen containing gas) is adjusted. In some embodiments, the total thickness does not change. Accordingly, when a desired sheet resistance value for a resistor wire is given, for example, by a circuit/device designer (device specification), the thicknesses of the layers of the metallic layer 200L are adjusted to obtain a desired sheet resistance for the metallic layer 200L.

FIGS. 6A-6F show various stages of a sequential fabrication process of a semiconductor device according to an embodiment of the present disclosure. It is understood that additional operations can be provided before, during, and after processes shown by FIGS. 6A-6F, and some of the operations described below can be replaced or eliminated, for additional embodiments of the method. The order of the operations/processes may be interchangeable. Further, materials, configurations, dimensions and/or processes as explained with respect to the foregoing embodiments may be employed in the following embodiment, and the detailed explanation may be omitted.

Figure 6A:
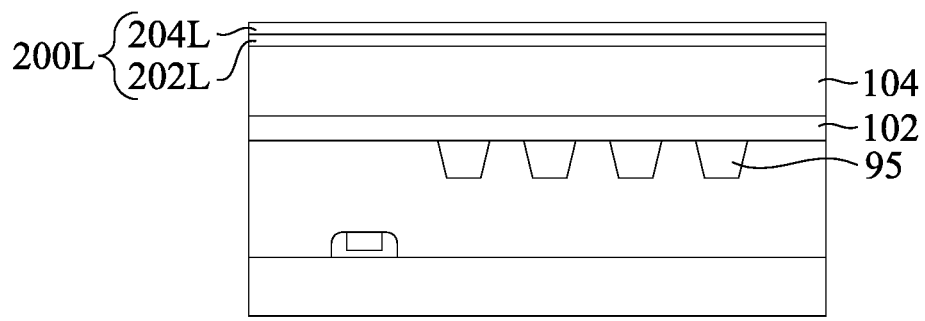
FIGS. 6A, 6B, 6C, 6D, 6E and 6F show cross sectional views of various stages of a sequential manufacturing process for a semiconductor device according to the present disclosure.

As shown in FIG. 6A, a blanket metallic layer 200L is formed over the second dielectric layer 104. In some embodiments, the blanket metallic layer 200L includes two or more layers, for example, a lower layer 202L and an upper layer 204L. In some embodiments, the lower layer 202L has a different sheet resistance than the upper layer 204L. In some embodiments, the lower layer 202L and the upper layer 204L are made of the same material (e.g., TiN or TaN), and the lower layer 202L is formed by sputtering with a first input power condition, and the upper layer 204L is formed by sputtering with a second input power condition different from the first input power condition. In some embodiments, the second layer 204L is formed with an input power during a sputtering process which is lower or higher than that for the first layer 202L.

In other embodiments, the lower layer 202L is made of a different material than the upper layer 204L. In some embodiments, the lower layer 202L is made of TiN and the upper layer 204L is made of TaN, or vice versa. In other embodiments, each of the lower layer 202L and the upper layer 204L includes Ti, Ta, W, WN, silicide, poly silicon or amorphous silicon, or any other suitable material for a resistor. The thickness of each layer is adjusted depending of the required sheet resistance value.

Figure 6B:
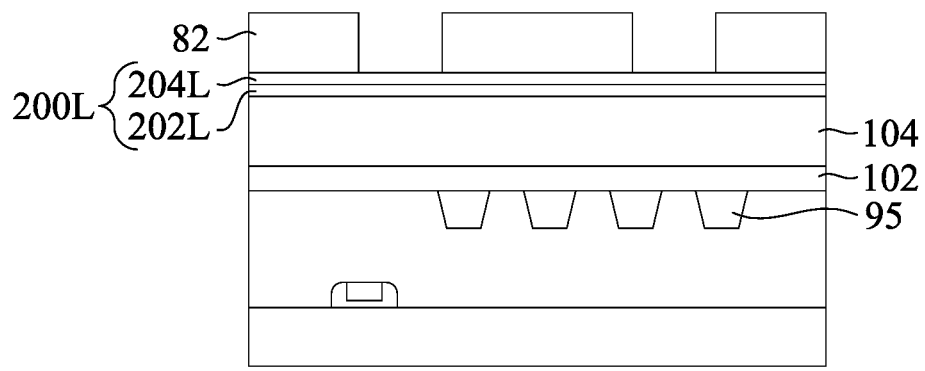
Figure 6C:
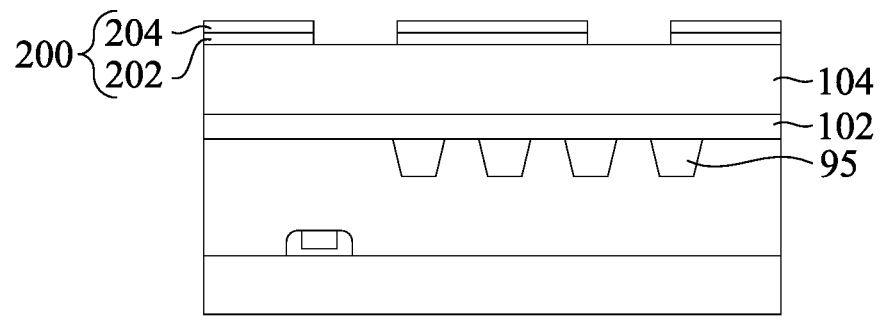

Then, as shown in FIG. 6B, a first mask layer 82 is formed over the blanket layer 200L. In some embodiments, the first mask layer 82 is a photo resist pattern. Next, as shown in FIG. 6C, the blanket layer 200L is pattered by one or more etching operations using the first mask layer 82 as an etching mask to form one or more resistor wires 200. Subsequently, the mask layer 82 is removed.

Figure 6D:
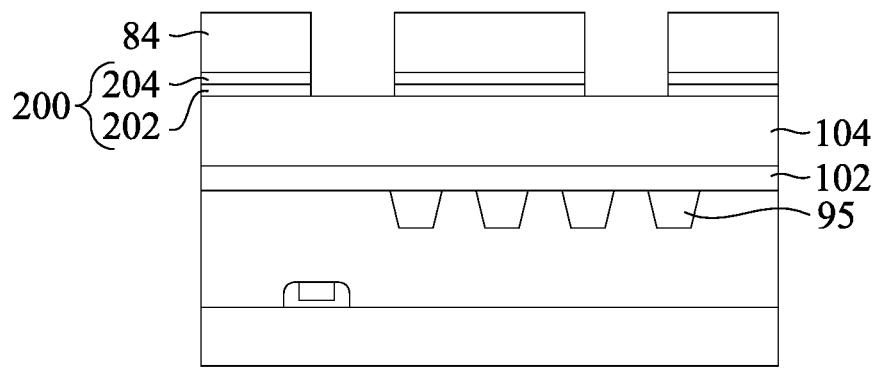
Figure 6E:
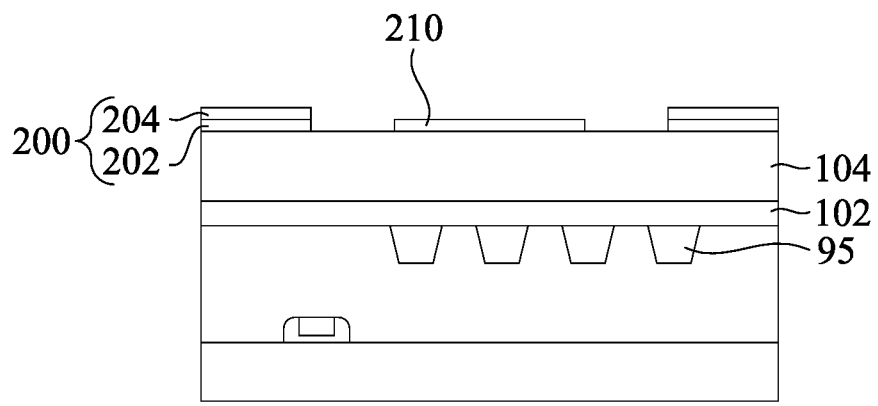
Figure 6F:
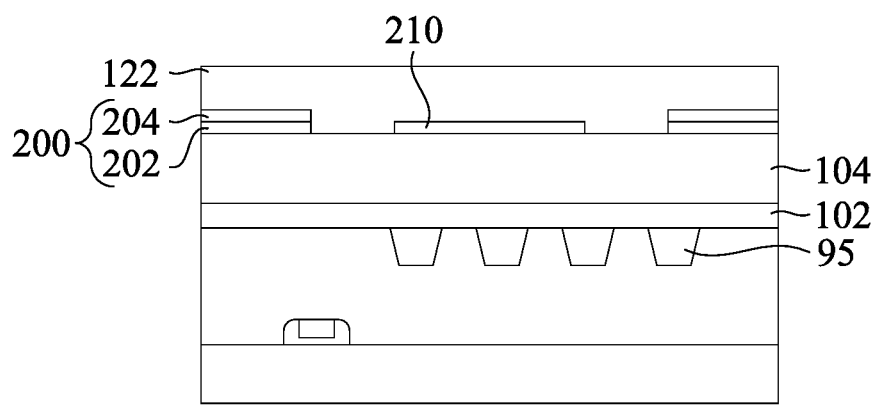

Further, a second mask layer 84, such as a photo resist pattern, is formed to cover one or more resistor wires 200 to expose one or more resistor wires 200 as shown in FIG. 6D. Then, as shown in FIG. 6E, the upper layer 204 is removed by one or more etching operations (dry and/or wet etching) using the second mask layer 84 as an etching mask to leave the lower layer 202 as resistor wires 210 having a higher sheet resistance than the bi-layer resistor wires 200. Subsequently, the mask layer 84 is removed, and then the third dielectric layer 122 is formed as shown in FIG. 6F. After the third dielectric layer 122 is formed, one or more dielectric layers are optionally formed over the third dielectric layer and contacts 300 as shown in FIGS. 1A-2B are formed.

In the embodiment shown in FIG. 6F, two resistor wires having different sheet resistances (different configuration in thickness, layer structure, etc.) are formed on the second dielectric layer 104 at the same level. When the blanket layer 200L includes three or more layers, it is possible to obtain three or more resistor wires having different sheet resistances (one layer, two layer, three layer . . . structures) on the second dielectric layer 104.

FIGS. 7A-7F show various stages of the sequential fabrication process of a semiconductor device according to an embodiment of the present disclosure. It is understood that additional operations can be provided before, during, and after processes shown by FIGS. 7A-7F, and some of the operations described below can be replaced or eliminated, for additional embodiments of the method. The order of the operations/processes may be interchangeable. Further, materials, configurations, dimensions and/or processes as explained with respect to the foregoing embodiments may be employed in the following embodiment, and the detailed explanation may be omitted.

Figure 7A:
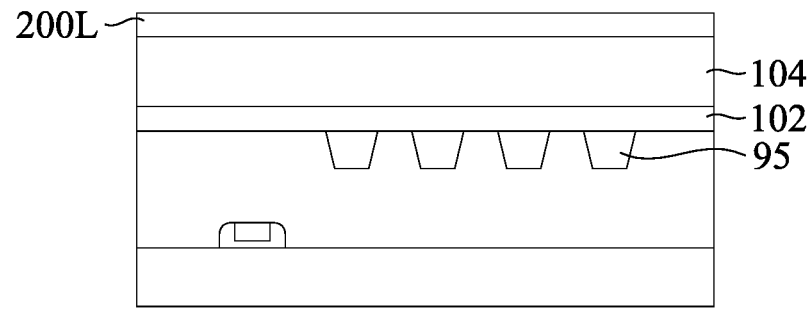
FIGS. 7A, 7B, 7C, 7D, 7E and 7F show cross sectional views of various stages of a sequential manufacturing process for a semiconductor device according to the present disclosure.

As shown in FIG. 7A, a blanket metallic layer 200L is formed over the second dielectric layer 104. In some embodiments, the blanket metallic layer 200L is a single layer of TiN or TaN. In other embodiments, the blanket layer 200L includes two or more layers.

Figure 7B:
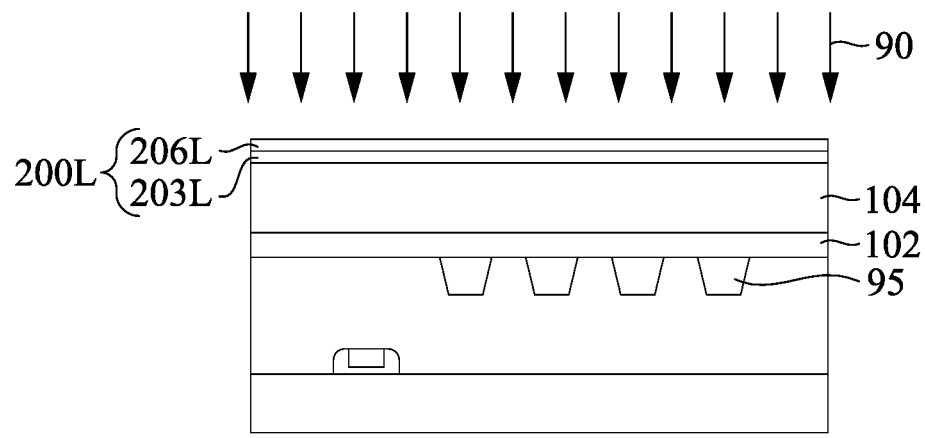

Then, as shown in FIG. 7B, a surface treatment operation 90 is performed to convert the surface region of the blanket layer 200L into a treated layer 206L and the remaining non-treated layer 203L. The resistance of the treated layer 206 increases or decreases compared to the resistance before the surface treatment. The thickness of the treated layer 206L is in a range from about 20% to about 70% of the initial thickness of the blanker layer 200L before the surface treatment, and in other embodiments, the thickness of the treated layer 206L is in a range from about 40% to about 60% of the initial thickness of the blanker layer 200L.

In some embodiments, the surface treatment is an oxidation of the blanket layer. The oxidation process includes thermal oxidation using oxygen or ozone, chemical oxidation using a solution, or plasma oxidation using an oxygen containing gas (e.g., 02, etc.). In such a case, the treated layer 206L has a higher oxygen concentration than the remaining layer 203L. In other embodiments, the surface treatment is a nitridation of the blanket layer using a plasma with a source gas of $N_2$ and/or $NH_3$. In such a case, the treated layer 206L has a higher nitrogen concentration than the remaining layer 203L. In some embodiments, the surface treatment includes ion implantation. In some embodiments, ions of O, C, F, P, $BF_2$, As, Si, Ge, and/or any other suitable elements are introduced into the surface region by one or more ion implantation operations. In some embodiments, two or more of the foregoing treatments are combined.

Figure 7C:
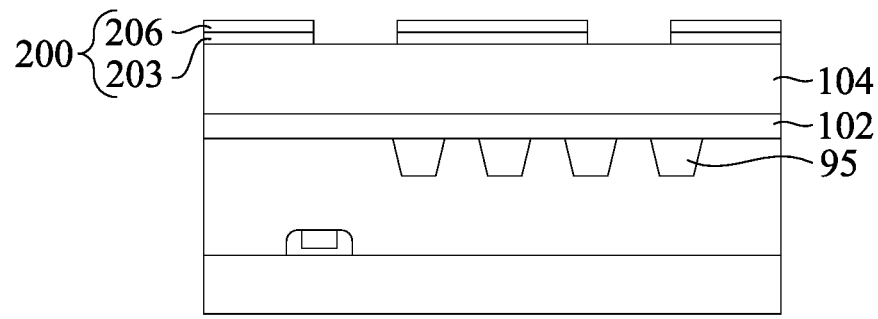

Then, similar to FIG. 6B, a first mask layer (not shown), e.g., a photo resist pattern, is formed over the blanket layer 200L, and the blanket layer 200L is pattered by one or more etching operations using the first mask layer as an etching mask to form one or more resistor wires 200 including a lower layer 203 of the remaining layer and an upper layer 206 of the treated layer. Subsequently, the mask layer is removed, as shown in FIG. 7C.

Figure 7D:
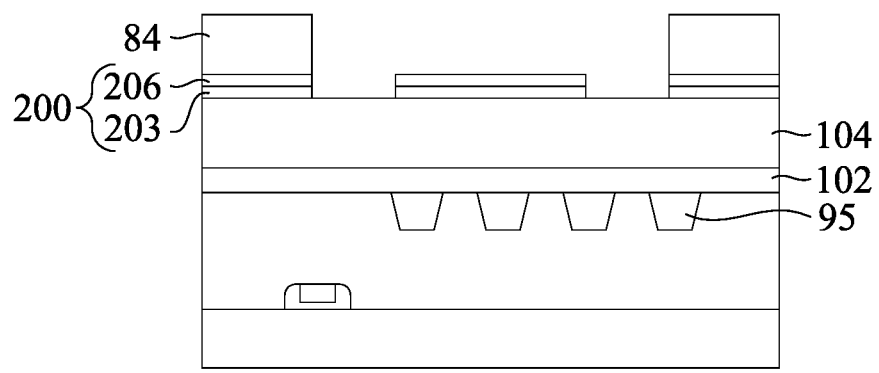
Figure 7E:
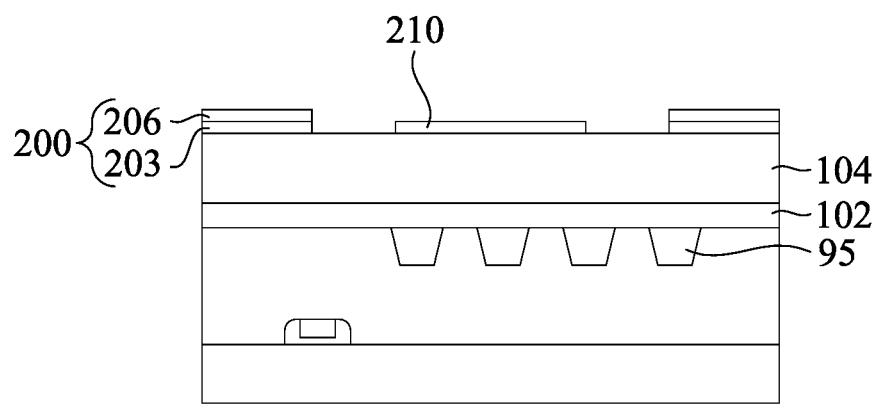
Figure 7F:
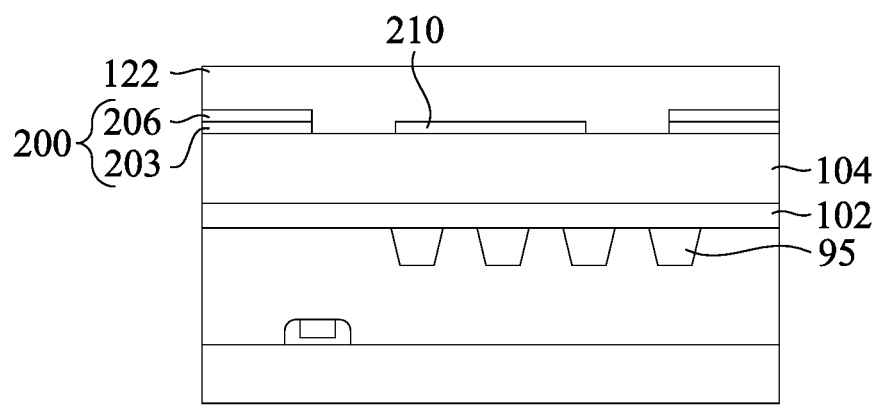

Further, a second mask layer 84, such as a photo resist pattern, is formed to cover one or more resistor wires 200 and to expose one or more resistor wires 200 as shown in FIG. 7D. Then, as shown in FIG. 7E, the upper layer 206 of the exposed resistor wires is removed by one or more etching operations (dry and/or wet etching) using the second mask layer 84 as an etching mask to leave the lower layer 203 as resistor wires 210 having a different sheet resistance than the bi-layer resistor wires 200. Subsequently, the mask layer 84 is removed, and then the third dielectric layer 122 is formed as shown in FIG. 7F. After the third dielectric layer 122 is formed, one or more dielectric layers are optionally formed over the third dielectric layer and contacts 300 as shown in FIGS. 1A-2B. In the embodiment shown in FIG. 7F, two resistor wires having different sheet resistances are formed on the second dielectric layer 104 at the same level.

FIGS. 8A-8F show various stages of a sequential fabrication process of a semiconductor device according to an embodiment of the present disclosure. It is understood that additional operations can be provided before, during, and after processes shown by FIGS. 8A-8F, and some of the operations described below can be replaced or eliminated, for additional embodiments of the method. The order of the operations/processes may be interchangeable. Further, materials, configurations, dimensions and/or processes as explained with respect to the foregoing embodiments may be employed in the following embodiment, and the detailed explanation may be omitted.

Figure 8A:
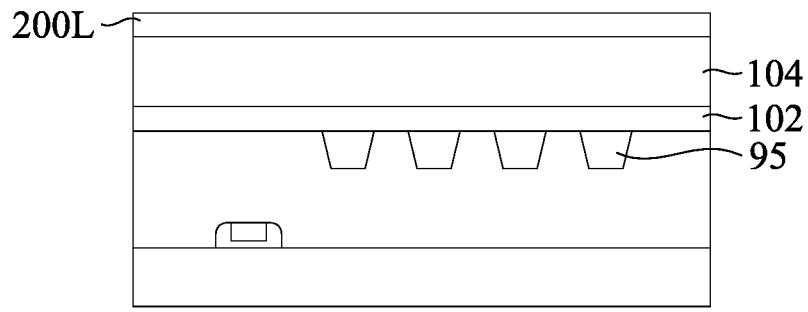
FIGS. 8A, 8B, 8C, 8D, 8E and 8F show cross sectional views of various stages of a sequential manufacturing process for a semiconductor device according to the present disclosure.

As shown in FIG. 8A, a blanket metallic layer 200L is formed over the second dielectric layer 104. In some embodiments, the blanket metallic layer 200L is a single layer of TiN or TaN. In other embodiments, the blanket layer 200L includes two or more layers.

Figure 8B:
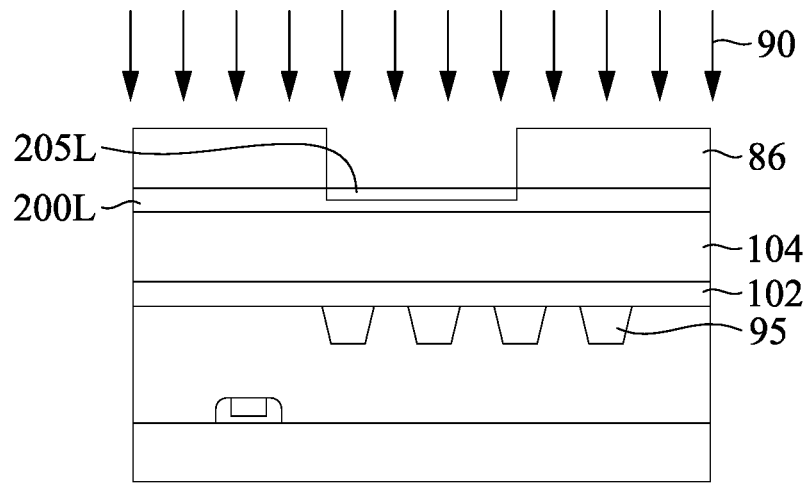

Then, as shown in FIG. 8B, a mask pattern 86, such as a photo resist pattern or a dielectric material hard mask pattern, is formed over the blanket layer 200L. Next, a surface treatment operation 90 is performed to convert a part of the surface region of the blanket layer 200L into a treated region 205L. The resistance of the treated region 205L increases or decreases compared to the blanket layer 200L before the surface treatment. The thickness of the treated region 205L is in a range from about 20% to about 80% of the initial thickness of the blanket layer 200L before the surface treatment, and in other embodiments, the thickness of the treated region 205L is in a range from about 40% to about 60% of the initial thickness of the blanker layer 200L.

Figure 8C:
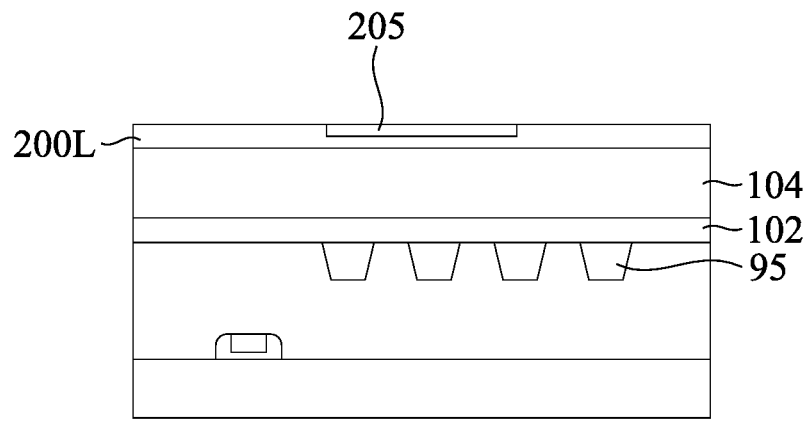

In some embodiments, the surface treatment is an oxidation of the blanket layer. The oxidation process includes thermal oxidation using oxygen or ozone, chemical oxidation using a solution, or plasma oxidation using an oxygen containing gas (e.g., 02, etc.). In such a case, the treated layer 205L has a higher oxygen concentration than the remaining layer. In other embodiments, the surface treatment is a nitridation of the blanket layer using a plasma with a source gas of $N_2$ and/or $NH_3$. In such a case, the treated region 205L has a higher nitrogen concentration than the remaining layer. In some embodiments, the surface treatment includes ion implantation. In some embodiments, ions of F, P, $BF_2$, As, Si, Ge, and/or any other suitable elements are introduced into the surface region by one or more ion implantation operations. In some embodiments, two or more of the foregoing treatments are combined. Then, the mask layer 86 is removed as shown in FIG. 8C.

Figure 8D:
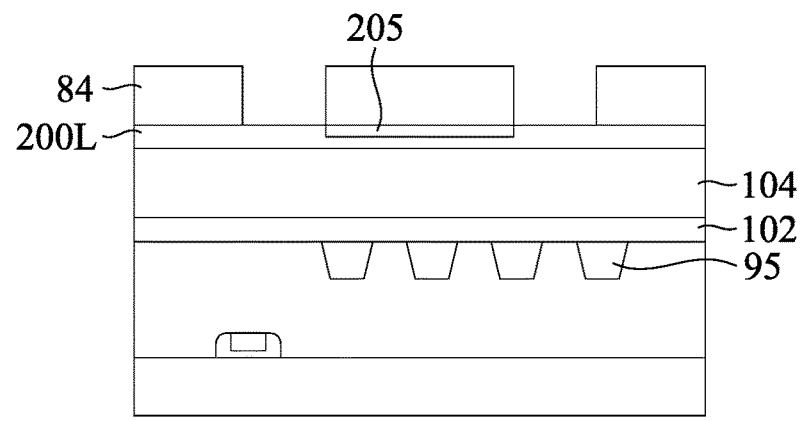
Figure 8E:
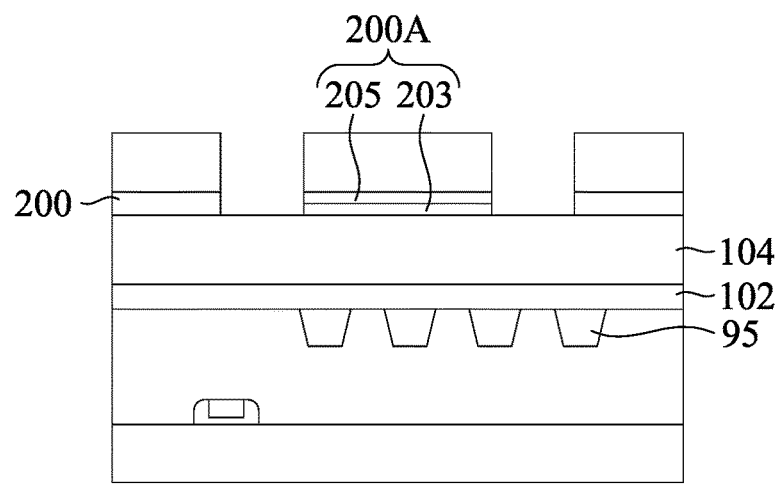
Figure 8F:
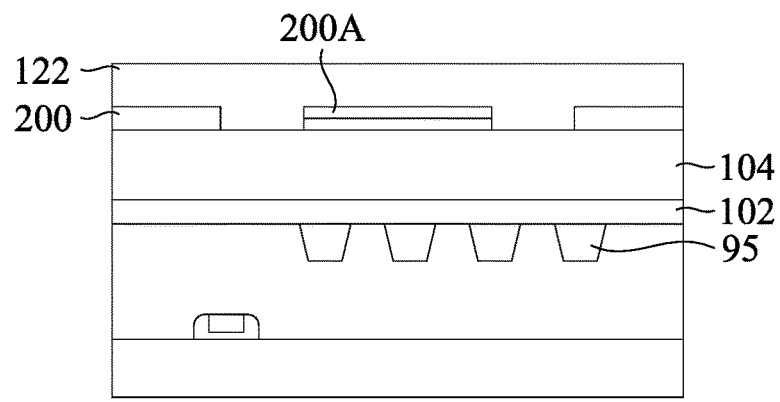

Further, a second mask layer 84, such as a photo resist pattern, is formed over the blanket layer 200L having the treated region 205, as shown in FIG. 8D. Then, as shown in FIG. 8E, the blanket layer 200L is patterned into one or more resistor wires 200 (a single layer structure or a layer without treated region) and one of more bilayer resistor wires 200A having the treated region 205 and a non-treated or remaining region 203 under the treated region. Subsequently, the mask layer 84 is removed, and then the third dielectric layer 122 is formed as shown in FIG. 8F. After the third dielectric layer 122 is formed, one or more dielectric layers are optionally formed over the third dielectric layer and contacts 300 as shown in FIGS. 1A-2B. In the embodiments, shown in FIG. 8F, two resistor wires having different sheet resistances are formed on the second dielectric layer 104 at the same level. In some embodiments, the thickness of the resistor wire 200 is substantially the same as the thickness of the bi-layer resistor wire 200A (e.g., the difference is smaller than about 0.2 nm).

FIGS. 9A-9F show various stages of a sequential fabrication process of a semiconductor device according to an embodiment of the present disclosure. It is understood that additional operations can be provided before, during, and after the processes shown by FIGS. 9A-9F, and some of the operations described below can be replaced or eliminated, for additional embodiments of the method. The order of the operations/processes may be interchangeable. Further, materials, configurations, dimensions and/or processes as explained with respect to the foregoing embodiments may be employed in the following embodiment, and the detailed explanation may be omitted.

Figure 9A:
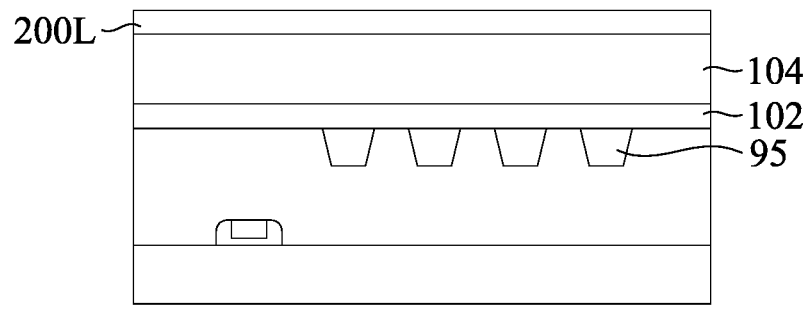
FIGS. 9A, 9B, 9C, 9D, 9E and 9F show cross sectional views of various stages of a sequential manufacturing process for a semiconductor device according to the present disclosure.

As shown in FIG. 9A, a first blanket metallic layer 200L is formed over the second dielectric layer 104. In some embodiments, the first blanket metallic layer 200L is a single layer of TiN or TaN. In other embodiments, the first blanket layer 200L includes two or more layers.

Figure 9B:
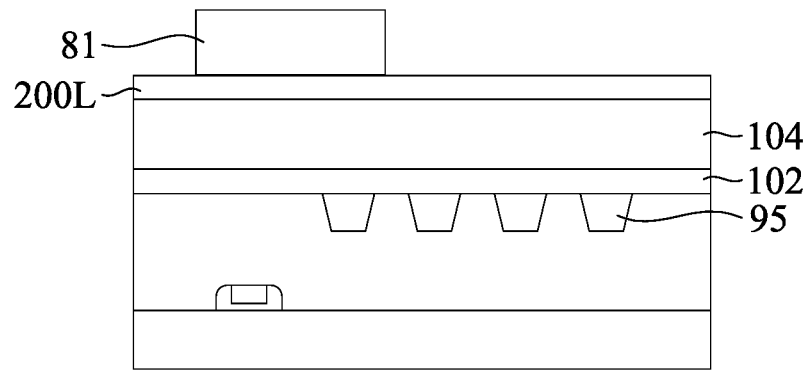
Figure 9C:
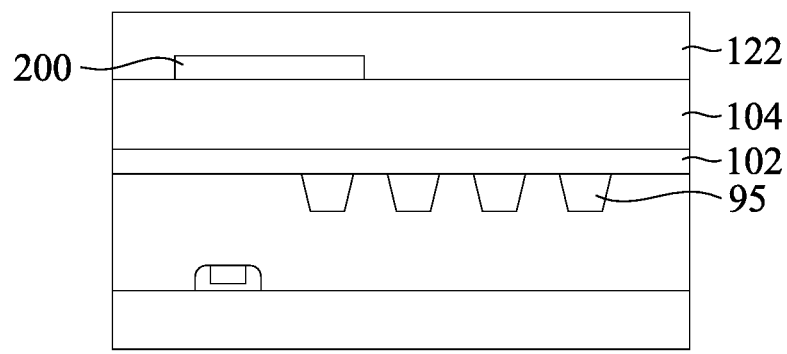

Then, as shown in FIG. 9B, a first mask layer 81, e.g., a photo resist pattern, is formed over the blanket layer 200L, and the blanket layer 200L is patterned by one or more etching operations using the first mask layer 81 as an etching mask to form one or more first resistor wires 200. Subsequently, the mask layer is removed and a third dielectric layer 122 is formed as shown in FIG. 9C.

Figure 9D:
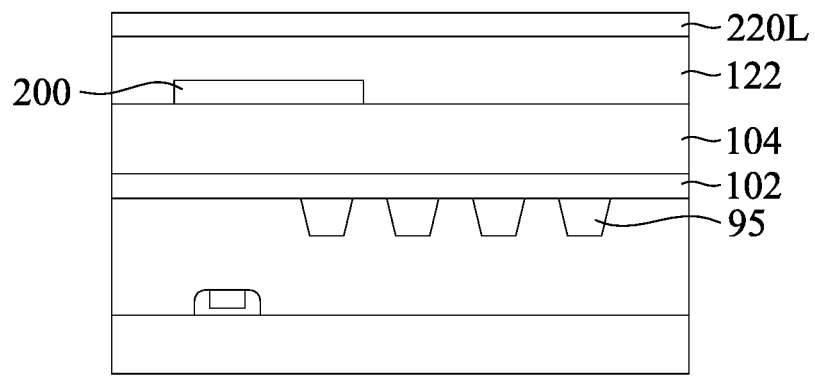

Further, as shown in FIG. 9D, a second blanket metallic layer 220L is formed over the third dielectric layer 122. In some embodiments, the second blanket metallic layer 220L has a different sheet resistance than the first blanket layer 200L. In some embodiments, the second blanket layer 220L is a single layer of TiN or TaN. In other embodiments, the second blanket layer 220L includes two or more layers. In some embodiments, the thickness of the second blanket layer 220L is substantially the same as the thickness of the first blanket layer 200L (e.g., the difference is smaller than about 0.2 nm).

Figure 9E:
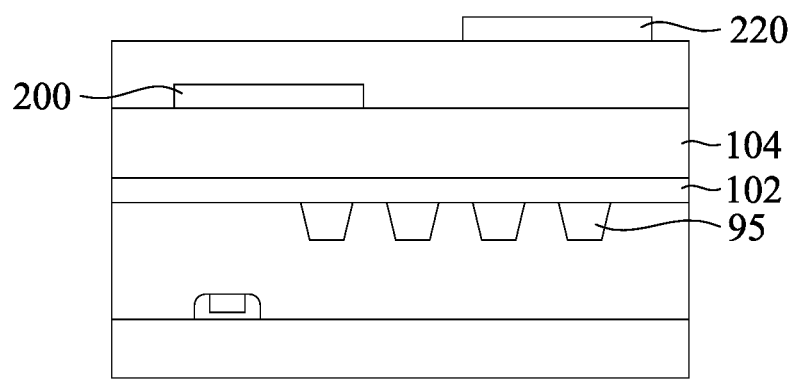
Figure 9F:
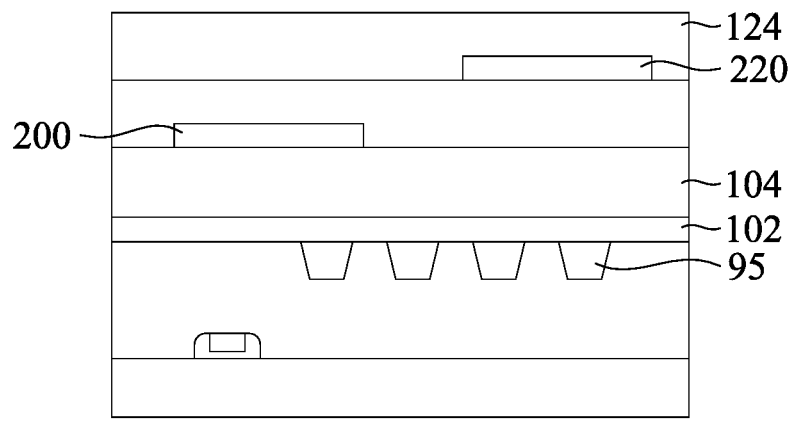

Then, similar to the patterning operation explained with respect to FIG. 9B, the second blanket layer 220L is patterned into one or more second resistor wires 220 as shown in FIG. 9E. Subsequently, the mask layer is removed and a fourth dielectric layer 124 is formed as shown in FIG. 9F. After the third dielectric layer 122 is formed, one or more dielectric layers are optionally formed over the third dielectric layer and contacts 300 as shown in FIGS. 1A-2B. In the embodiments, shown in FIG. 9F, two resistor wires having different sheet resistances (and having the same thickness) are formed at the different levels. In some embodiments, one or more dielectric layers are formed between the third dielectric layer 122 and the fourth dielectric layer 124. In some embodiments, one or both of the first blanket layer 200L and the second blanket layer 220L includes the surface treated layer or region as set forth above.

FIGS. 10A-10F show various stages of a sequential fabrication process of a semiconductor device according to an embodiment of the present disclosure. It is understood that additional operations can be provided before, during, and after processes shown by FIGS. 10A-10F, and some of the operations described below can be replaced or eliminated, for additional embodiments of the method. The order of the operations/processes may be interchangeable. Further, materials, configurations, dimensions and/or processes as explained with respect to the foregoing embodiments may be employed in the following embodiment, and the detailed explanation may be omitted.

Figure 10A:
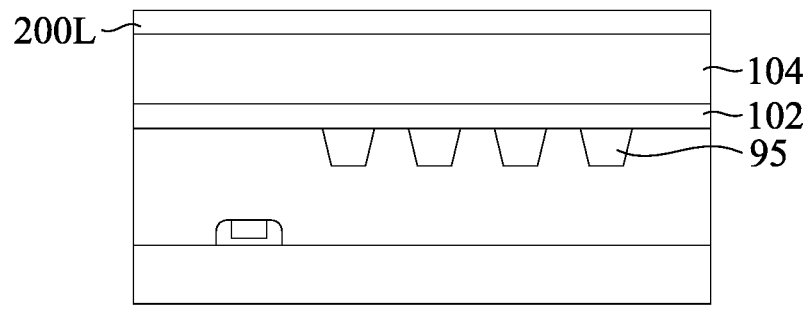
FIGS. 10A, 10B, 10C, 10D, 10E and 10F show cross sectional views of various stages of a sequential manufacturing process for a semiconductor device according to the present disclosure.

As shown in FIG. 10A, a first blanket metallic layer 200L is formed over the second dielectric layer 104. In some embodiments, the first blanket metallic layer 200L is a single layer of TiN or TaN. In other embodiments, the first blanket layer 200L includes two or more layers.

Figure 10B:
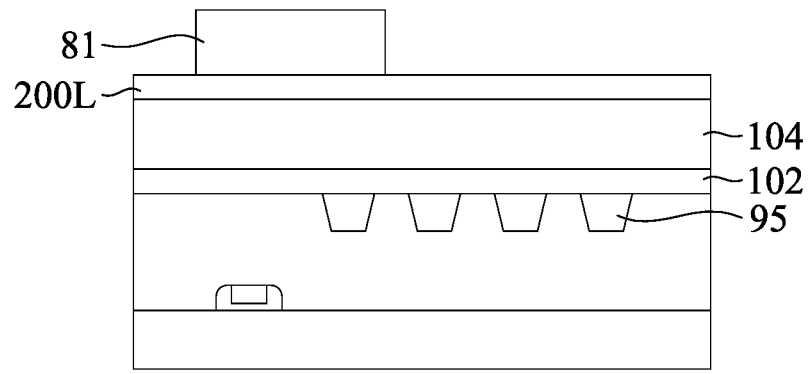
Figure 10C:
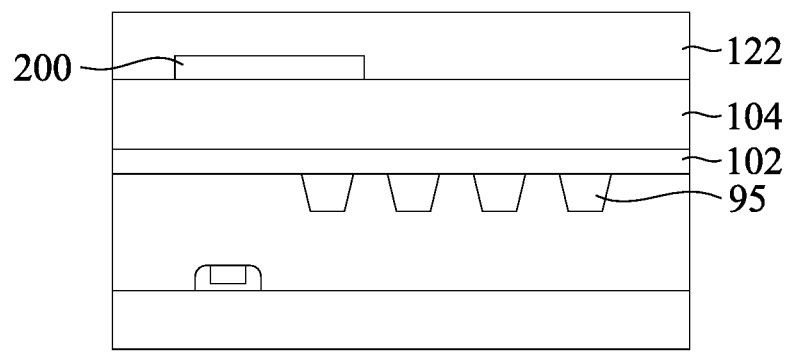

Then, as shown in FIG. 10B, a first mask layer 81, e.g., a photo resist pattern, is formed over the blanket layer 200L, and the blanket layer 200L is patterned by one or more etching operations using the first mask layer 81 as an etching mask to form one or more first resistor wires 200. Subsequently, the mask layer is removed and a third dielectric layer 122 is formed as shown in FIG. 10C.

Figure 10D:
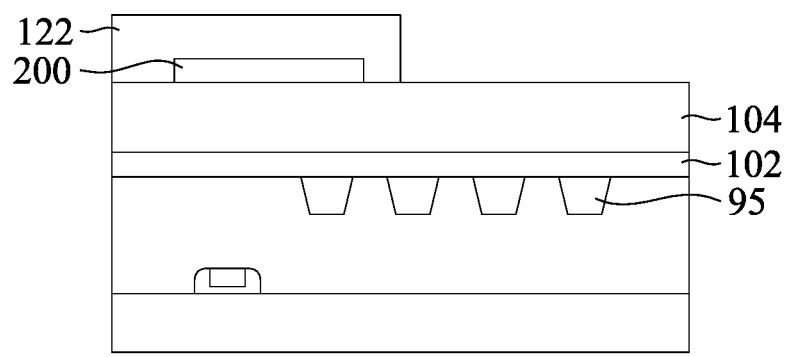
Figure 10E:
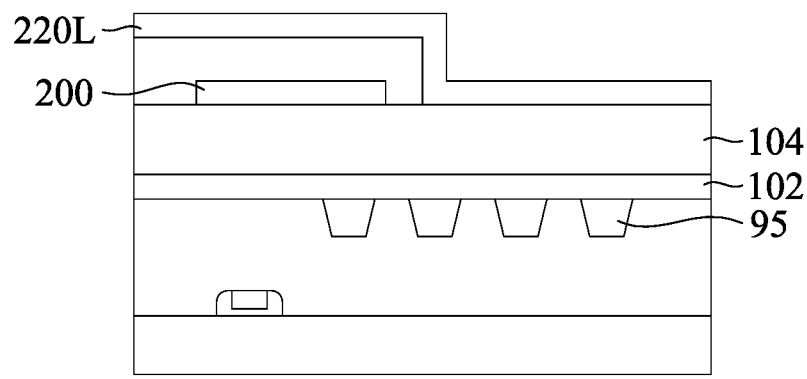

Further, as shown in FIG. 10D, the third dielectric layer 122 is patterned to partially expose the second dielectric layer 104. Then, a second blanket metallic layer 220L is formed over the third dielectric layer 122 and the second dielectric layer 104 as shown in FIG. 10E. In some embodiments, the second blanket metallic layer 220L has a different sheet resistance than the first blanket layer 200L. In some embodiments, the second blanket layer 220L is a single layer of TiN or TaN. In other embodiments, the second blanket layer 220L includes two or more layers. In some embodiments, the thickness of the second blanket layer 220L is substantially the same as the thickness of the first blanket layer 200L (e.g., the difference is smaller than about 0.2 nm).

Figure 10F:
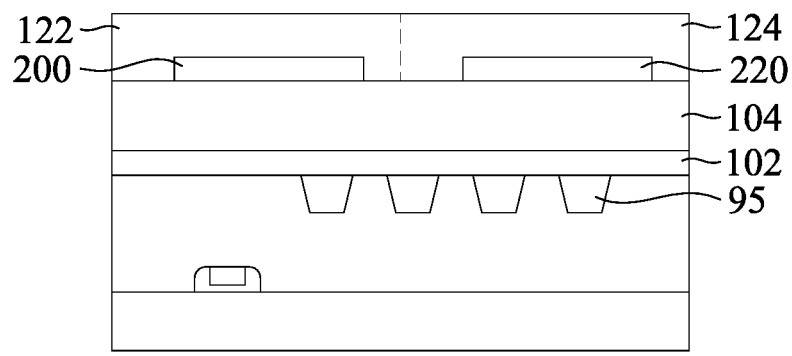

Then, similar to the patterning operation explained with respect to FIG. 10B, the second blanket layer 220L is patterned into one or more second resistor wires 220 disposed on the second dielectric layer 104. Subsequently, the mask layer is removed and a fourth dielectric layer 124 is formed as shown in FIG. 10F. After the fourth dielectric layer 124 is formed, one or more dielectric layers are optionally formed over the third and fourth dielectric layers and contacts 300, as shown in FIGS. 1A-2B, are formed. In the embodiment shown in FIG. 10F, two resistor wires having different sheet resistances (and having the same thickness) are formed at the same level. In some embodiments, one or both of the first blanket layer 200L and the second blanket layer 220L includes the surface treated layer or region as set forth above.

It is understood that the devices shown in FIGS. 6F, 7F, 8F, 9F and 10F undergo further CMOS processes to form various features such as interconnect metal layers, dielectric layers, passivation layers, etc.

The various embodiments or examples described herein offer several advantages over the existing art. For example, in the present disclosure, by adjusting one or more deposition parameters for depositing a blanket layer for resistor wires, it is possible to flexibly adjust the sheet resistance value according to the design and/or device requirements. In addition, resistor wires disposed at the same vertical level have different structures, and thus have different sheet resistance, which improves the flexibility of device design.

It will be understood that not all advantages have been necessarily discussed herein, no particular advantage is required for all embodiments or examples, and other embodiments or examples may offer different advantages.

According to one aspect of the present disclosure, in a method of manufacturing a semiconductor device, a first dielectric layer is formed over an electronic circuit formed on a substrate, a blanket layer of a resistance material is formed over the first dielectric layer, a surface region of the blanket layer is treated to make a resistivity of the surface region different from a remaining region of the blanket layer, after the treatment, the blanket layer is patterned to form a resistor pattern. In one or more of the foregoing and following embodiments, one or more parameters in the treating are set according to a desired sheet resistance of the resistor pattern. In one or more of the foregoing and following embodiments, after the treating, the surface region has a higher resistivity than the remaining region. In one or more of the foregoing and following embodiments, the blanket layer includes TiN. In one or more of the foregoing and following embodiments, the treatment includes oxidation and after the treating, the surface region includes titanium oxide or titanium oxynitride. In one or more of the foregoing and following embodiments, the oxidation includes plasma oxidation. In one or more of the foregoing and following embodiments, one of the one or more parameters include a treating time. In one or more of the foregoing and following embodiments, the treating includes nitridation. In one or more of the foregoing and following embodiments, the treating includes ion implantation.

In accordance with another aspect of the present disclosure, in a method of manufacturing a semiconductor device, a first dielectric layer is formed over an electronic circuit formed on a substrate, a blanket layer of a resistance material is formed over the first dielectric layer, a first mask pattern is formed on the blanket layer, through the first mask pattern, a part of a surface region of the blanket layer is treated to make a resistivity of the surface region different from a remaining region of the blanket layer, and after the treatment, the first mask pattern is removed, and the blanket layer is patterned to form a first resistor pattern and a second resistor pattern using a second mask pattern. A sheet resistance of the first resistor pattern is different from a sheet resistance of the second resistor pattern. In one or more of the foregoing and following embodiments, the first resistor pattern includes a treated surface region and the second resistor pattern includes no treated surface region. In one or more of the foregoing and following embodiments, the treating includes oxidation and after the treating, the surface region includes titanium oxide or titanium oxynitride. In one or more of the foregoing and following embodiments, the oxidation includes implantation of oxygen. In one or more of the foregoing and following embodiments, the oxidation includes plasma oxidation. In one or more of the foregoing and following embodiments, the first dielectric layer incudes a SiCN layer and a silicon nitride layer formed on the SiCN layer.

In accordance with another aspect of the present disclosure in a method of manufacturing a semiconductor device, a first dielectric layer is formed over an electronic circuit formed on a substrate, and a blanket layer is formed over the first dielectric layer. The blanket layer includes a lower layer and an upper layer made of a different resistance than the lower layer. A first mask pattern is formed on the blanket layer, the blanket layer is patterned to form a first pattern as a first resistor pattern and a second pattern using a first mask pattern, a second mask pattern is formed to cover the first pattern, and the upper layer is removed from the second pattern, thereby forming a second resistor pattern. A sheet resistance of the first resistor pattern is different from a sheet resistance of the second resistor pattern. In one or more of the foregoing and following embodiments, the upper layer is made of a different material than the lower layer. In one or more of the foregoing and following embodiments, the upper layer and the lower layer are made of TiN, and a deposition condition of the upper layer is different from a deposition condition of the lower layer. In one or more of the foregoing and following embodiments, the deposition condition is an input electric power of a sputtering process. In one or more of the foregoing and following embodiments, the upper layer includes oxide or oxynitride, and lower layer includes metal nitride.

In accordance with another aspect of the present disclosure, in a method of manufacturing a semiconductor device, a first dielectric layer is formed over an electronic circuit formed on a substrate, a blanket layer of a resistance material is formed over the first dielectric layer, and the blanket layer is patterned to form a resistor pattern. The blanket layer is formed by a plasma chemical vapor deposition (PCVD) or a sputtering process, and one or more parameters in the PCVD or the sputtering process are set according to a desired sheet resistance of the resistor pattern. In one or more of the foregoing and following embodiments, one of the one or more parameters is input power for generating plasma of the PCVD or input power for sputtering. In one or more of the foregoing and following embodiments, the blanket layer includes TiN. In one or more of the foregoing and following embodiments, a thickness of the blanket layer is in a range from 20 nm to 40 nm. In one or more of the foregoing and following embodiments, the blanket layer includes at least one of TiN or TaN. In one or more of the foregoing and following embodiments, the blanket layer includes a first TiN layer and a second TiN layer formed on the first TiN layer, and a sheet resistance of the first TiN layer is different from a sheet resistance of the second TiN layer. In one or more of the foregoing and following embodiments, a film formation condition of the first TiN is different from a film formation condition of the second TiN. In one or more of the foregoing and following embodiments, a film formation condition of the first TiN is different from a film formation condition of the second TiN. In one or more of the foregoing and following embodiments, input power in the PCVD or input power for sputtering for the first TiN is different from input power in the PCVD or input power for sputtering for the second TiN.

In accordance with another aspect of the present disclosure, a semiconductor device includes a transistor structure disposed over a substrate, a first interlayer dielectric (ILD) layer disposed over the transistor structure, a second ILD layer disposed over the first ILD layer, and a first resistor wire disposed on the second ILD layer, and a second resistor wire disposed on the second ILD layer. A sheet resistance of the first resistor wire is different from a sheet resistance of the second resistor wire. In one or more of the foregoing and following embodiments, the first and second resistor wires are made of TiN or TaN. In one or more of the foregoing and following embodiments, a crystallinity of TiN or TaN of the lower layer is different from a crystallinity of TiN or TaN of the upper layer. In one or more of the foregoing and following embodiments, a different in thickness between the first resistor wire and the second resistor wire is smaller than 0.2 nm. In one or more of the foregoing and following embodiments, the second ILD layer incudes a SiCN layer and a silicon nitride layer formed on the SiCN layer, and the first and second resistor wires are in direct contact with the silicon nitride layer. In one or more of the foregoing and following embodiments, the sheet resistance of the first resistor wire and the sheet resistance of the second resistor wire are in a range from 10Ω/☐ to 200Ω/☐, respectively. In one or more of the foregoing and following embodiments, at least one of the first or second resistor wires overlaps the transistor structure in plan view. In one or more of the foregoing and following embodiments, the transistor structure is a dummy transistor.

In accordance with another aspect of the present disclosure, a semiconductor device includes a transistor structure disposed over a substrate, a first interlayer dielectric (ILD) layer disposed over the transistor structure, a second ILD layer disposed over the first ILD layer, and a first resistor wire disposed on the second ILD layer, and a second resistor wire disposed on the second ILD layer. Each of the first resistor wire and the second resistor wire includes one or more resistor material layers, and a number of the resistor material layers of the first resistor wire is smaller than a number of the resistor material layers of the second resistor wire. In one or more of the foregoing and following embodiments, at least one of the resistor material layers of each of the first and second resistor wires includes at least one of TiN or TaN. In one or more of the foregoing and following embodiments, the second resistor wire includes a lower layer and an upper layer, and the upper layer has a higher concentration of element A than the lower layer, where the element A is at least one of O, N, F, C, As, B, P, or Si. In one or more of the foregoing and following embodiments, the element A is oxygen. In one or more of the foregoing and following embodiments, the second resistor wire includes a lower layer and an upper layer, both made of TiN, and a crystallinity of TiN of the lower layer is different from a crystallinity of TiN of the upper layer. In one or more of the foregoing and following embodiments, the second ILD layer incudes a SiCN layer and a silicon nitride layer formed on the SiCN layer, and the first and second resistor wires are in direct contact with the silicon nitride layer. In one or more of the foregoing and following embodiments, the sheet resistance of the first resistor wire and the sheet resistance of the second resistor wire are in a range from 10Ω/☐ to 1000Ω/☐, respectively. In one or more of the foregoing and following embodiments, at least one of the first or second resistor wires overlaps the transistor structure in plan view. In one or more of the foregoing and following embodiments, the transistor structure is a dummy transistor.

In accordance with another aspect of the present disclosure, a semiconductor device includes a transistor structure disposed over a substrate, a first interlayer dielectric (ILD) layer disposed over the transistor structure, a second ILD layer disposed over the first ILD layer, and a first resistor wire disposed on the second ILD layer, and a second resistor wire disposed on the second ILD layer. The first resistor wire consists of a single layer and the second resistor wire consists of two layers having different resistivity from each other. In one or more of the foregoing and following embodiments, each of the first and second resistor wires includes at least one of TiN or TaN. In one or more of the foregoing and following embodiments, the second ILD layer incudes a SiCN layer and a silicon nitride layer formed on the SiCN layer, and the first and second resistor wires are in direct contact with the silicon nitride layer.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
    forming a first dielectric layer over an electronic circuit formed on a substrate;
    forming a blanket layer of a resistance material over the first dielectric layer;
    treating a surface region of the blanket layer to make a resistivity of the surface region different from a remaining region of the blanket layer; and
    after the treating, patterning the blanket layer to form a resistor pattern,
    wherein one or more parameters in the treating are set according to a desired sheet resistance of the resistor pattern.

2. The method of claim 1, wherein after the treating, the surface region has a higher resistivity than the remaining region.

3. The method of claim 1, wherein the blanket layer includes TiN.

4. The method of claim 3, wherein the treating includes an oxidation and after the treating, the surface region includes a titanium oxide or a titanium oxynitride.

5. The method of claim 3, wherein the oxidation includes plasma oxidation.

6. The method of claim 3, wherein one of the one or more parameters include a time duration of treating.

7. The method of claim 1, wherein the treating includes a nitridation.

8. The method of claim 1, wherein the treating includes an ion implantation.

9. A method of manufacturing a semiconductor device, comprising:
    forming a first dielectric layer over an electronic circuit formed on a substrate;
    forming a blanket layer of a resistance material over the first dielectric layer;
    forming a first mask pattern on the blanket layer;
    treating, through the first mask pattern, a part of a surface region of the blanket layer to make a resistivity of the surface region different from a remaining region of the blanket layer;
    after the treating, removing the first mask pattern; and patterning the blanket layer to form a first resistor pattern and a second resistor pattern using a second mask pattern, wherein:
a sheet resistance of the first resistor pattern is different from a sheet resistance of the second resistor pattern.

10. The method of claim 9, wherein the first resistor pattern includes a treated surface region that was treated during the treating, and the second resistor pattern does not include a region that was treated during the treating.

11. The method of claim 9, wherein the treating includes an oxidation and after the treating, the surface region includes titanium oxide or titanium oxynitride.

12. The method of claim 11, wherein the oxidation includes an implantation of oxygen.

13. The method of claim 11, wherein the oxidation includes a plasma oxidation.

14. The method of claim 9, wherein the first dielectric layer incudes a SiCN layer and a silicon nitride layer formed on the SiCN layer.

15. A method of manufacturing a semiconductor device, comprising:
forming a first dielectric layer over an electronic circuit formed on a substrate;
forming a second dielectric layer over the first dielectric layer;
forming a blanket layer of a resistance material over the second dielectric layer;
forming a first mask pattern on the blanket layer;
treating, through the first mask pattern, a part of a surface region of the blanket layer to make a resistivity of the surface region different from a remaining region of the blanket layer;
after the treating, removing the first mask pattern;
patterning the blanket layer to form a first resistor pattern and a second resistor pattern using a second mask pattern; and
forming a third dielectric layer over the first resistor pattern and the second resistor pattern.

16. The method of claim 15, wherein the first dielectric layer comprises one or more selected from the group consisting of silicon oxide, SiCN, SiOCN, and SiOC.

17. The method of claim 15, wherein the second dielectric layer is made of a different material than the first dielectric layer.

18. The method of claim 15, wherein the second dielectric layer comprises silicon nitride.

19. The method of claim 15, wherein the third dielectric layer is made of a different material than the second dielectric layer.

20. The method of claim 9, wherein one or more parameters in the treating are set according to a desired sheet resistance of the resistor pattern.

* * * * *